US006760454B1

(12) United States Patent
Shreve et al.

(10) Patent No.: US 6,760,454 B1
(45) Date of Patent: Jul. 6, 2004

(54) PASSIVE VOICE-ACTIVATED MICROPHONE AND TRANSCEIVER SYSTEM

(75) Inventors: Gregory A. Shreve, Huntsville, AL (US); Robert B. Stokes, Rancho Palos Verdes, CA (US); Marshall Y. Huang, Rancho Palos Verdes, CA (US); Barry R. Allen, Redondo Beach, CA (US)

(73) Assignee: TRW Inc., Redondo Beach, CA (US)

( * ) Notice: Subject to any disclaimer, the term of this patent is extended or adjusted under 35 U.S.C. 154(b) by 803 days.

(21) Appl. No.: 09/632,444

(22) Filed: Aug. 4, 2000

(51) Int. Cl.[7] .................... H03G 3/20
(52) U.S. Cl. .................... 381/110; 340/10.41; 455/88
(58) Field of Search .................... 381/110, 111, 381/92; 455/41.1, 106, 88, 41.2, 41.8, 41.9, 420, 41.3; 340/10.1–10.6, 10.31, 10.41, 10.51, 10.42, 5.61–5.63, 5.72, 5.52, 426.16; 367/198, 197, 199; 701/4; 704/273, 275; 307/10.1, 10.2, 10.5; 342/41–52

(56) References Cited

U.S. PATENT DOCUMENTS 3,931,622 A * 1/1976 Freedman .................... 342/42
4,675,656 A * 6/1987 Narcisse .................... 340/539.21
5,706,399 A * 1/1998 Bareis .................... 704/274
5,721,783 A * 2/1998 Anderson .................... 381/328
6,433,671 B1 * 8/2002 Nysen .................... 340/10.41
6,606,280 B1 * 8/2003 Knittel .................... 367/198

* cited by examiner

*Primary Examiner*—Duc Nguyen
*Assistant Examiner*—Lun-See Lao
(74) *Attorney, Agent, or Firm*—Tarolli, Sundheim, Covell & Tummino L.L.P.

(57) ABSTRACT

A voice-activated microphone and transceiver system includes an interrogator unit for transmitting a signal, receiving a modulated signal, and demodulating the modulated signal such that the difference between the transmitted signal and the modulated signal correspond to a unique sound wave signal. An acoustically driven microphone unit is also included for receiving the signal from the interrogator unit, modulating the signal with the sound wave signal, wherein the sound wave signal contains instructions for controlling an electronic device, and transmitting the modulated signal back to the interrogator unit for analysis by a signal processor.

22 Claims, 5 Drawing Sheets

PASSIVE VOICE-ACTIVATED MICROPHONE AND TRANSCEIVER SYSTEM

BACKGROUND OF THE INVENTION

1. Field of the Invention

The present invention relates to an integrated microphone and transceiver system that allows voice-activated control of computer driven devices using a passive and wireless interface.

2. Description of the Prior Art

As the number of systems that are computer controlled increases, so too increases the need for more sophisticated approaches to controlling such systems. In particular, there is a need for voice-activated control of computer systems. For example, in automobile control systems, a driver's voice could be used to activate or deactivate accessories including, but not limited to, radios, headlights, cabin lights, windshield wipers and cellular phones. And, by controlling such accessories using voice-activation, a driver's hands would be freed up to operate the steering wheel, thus allowing the driver to more easily focus on the conditions of the road. Additionally, voice activation could be used in homes or similar environments to unlock doors, turn on and off lights, turn on and off appliances, etc. Conventional techniques for controlling computer systems are generally less effective, since they require manual intervention on the part of the system user. And, in those cases where control is carried out by voice activation, problems related to recognizing a voice in the presence of ambient noise and problems related to providing power to the microphone unit still exist. Problems related to recognizing a voice in the presence of ambient noise typically exist when the source of an operator's voice is located distant from the computer or the operator is situated in a noisy environment. For example, in the noisy interior of a car, recognition of a driver's voice is difficult unless the microphone is located close the driver's mouth. And, while both wired and wireless microphones are currently available, each presents problems related to powering the microphone. For example, wired microphones require costly wires that typically run through a car's body to the seatbelt, and frequent retracting of the seatbelt can eventually sever the wires. On the other hand, wireless microphones require batteries, and consumers are reluctant to replace batteries regularly since generally the equipment in a car's interior requires no such similar maintenance over the life of the car.

Thus, an integrated microphone and transceiver system for providing voice activated control of a computer system using a passive and wireless interface that does not require battery power is highly desirable.

SUMMARY OF THE INVENTION

The preceding and other shortcomings of the prior art are addressed and overcome by the present invention that provides a voice-activated microphone and transceiver system for providing sound wave activated control of an electronic device system. The system includes an interrogator unit for transmitting a signal pulse, receiving a modulated signal pulse, and demodulating the modulated signal pulse such that the delay between the transmitted signal pulse and the modulated signal pulse corresponds to a unique sound wave signal that is used to control the electronic device. A acoustically driven microphone unit is also included for receiving the signal pulse from the interrogator unit, modulating the signal pulse with the sound wave signal, wherein the sound wave signal contains instructions for controlling an electronic device, and transmitting the modulated signal pulse back to the interrogator unit for analysis by a signal processor.

In an alternate embodiment of the present inventions, an optical signal is transmitted from an optical interrogator unit and is received and reflected by an optical microphone unit. The optical signal is modulated in amplitude in response to the air pressure of a voice sound wave signal in the area surrounding the microphone unit and reflected back toward the interrogator source where a voice signal processor unit eventually processes it.

BRIEF DESCRIPTION OF THE DRAWINGS

Reference is now made to the following description and attached drawings, wherein.

DETAILED DESCRIPTION OF THE INVENTION

A system for providing voice-activated control of an electronic device is illustrated.

Generally, a signal pulse, such as a radio frequency (RF) signal pulse, is transmitted from an interrogator unit to a microphone unit. The microphone unit receives the signal pulse and modulates the transmitted signal pulse with a sound wave corresponding to a voice sound wave signal. The modulated signal is produced as a RF echo where the sound pressure from a voice in the air surrounding the microphone unit modulates the RF echo's delay or ringing frequency. Afterwards, the microphone unit retransmits the modulated version of the signal to the interrogator unit, where the voice signal is detected and later processed by a voice signal processor unit.

Alternatively, an optical signal is transmitted from an optical interrogator unit and is received and reflected by an optical microphone unit. The optical signal is modulated in amplitude in response to the air pressure of a voice sound wave signal in the area surrounding the microphone unit and reflected back toward the interrogator source where a voice signal processor unit eventually processes it.

For purposes of describing the preferred embodiments of the present invention, the present invention is illustrated using voice activation to control automobile systems. However, it is important to note that the present invention is not limited to providing control for a particular computer system or electronic device. In fact, the present invention can be utilized to provide voice-activated control of any computer-based system, including, but not limited to automobile systems and home systems (e.g. unlocking doors, turning on and off lights, appliances etc.). The present invention can also be utilized to provide access to secured systems, for example, those systems that grant access to a user only upon recognition of a uniquely identifiable voice signal command.

Figure 1:
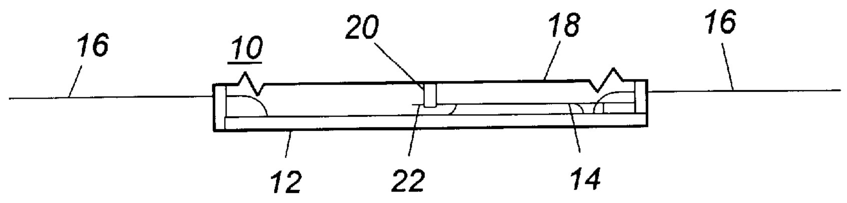
FIG. 1 is a mechanical diagram of a surface acoustic wave (SAW) microphone unit in accordance with an embodiment of the present invention.

Referring to FIG. 1, in a first embodiment of the present invention, a microphone unit 10, herein further referenced as a surface acoustic wave (SAW) microphone unit, is illustrated including a housing 12, a thin flexible SAW element 14 mounted within the housing 12, an antenna (or alternatively multiple antennas) 16 attached to the SAW element 14 through the housing 12 and a diaphragm cover 18 that seals the opening of the housing 12. The SAW microphone unit 10 is preferably mounted on the driver's seatbelt, or, alternatively, to increase the microphone unit's reception sensitivity, multiple microphone units can be mounted on the driver's seatbelt. The housing 12 is preferably an approximately 0.1 inch thick ceramic package that includes feedthroughs and printed RF traces (not shown). The SAW element 14 is preferably a single-transducer SAW delay line device formed from an approximately 4 mil (0.004 inch) thick lithium niobate ($LiNbO_3$) piezoelectric crystal, but may alternatively be a SAW resonator device. The antennas 16 are shown in FIG. 1 as wire dipole antennas, but the antennas 16 may alternatively include patch, loop, or other small antennas that are suitable for RF frequency use.

The SAW element 14, illustrated in FIG. 1 as a SAW delay line, provides a delayed echo of an applied RF signal burst. In particular, the SAW delay line includes an interdigital metal film transducer (not shown) that consists of two groups of interdigital electrode fingers separated by a gap area (not shown). When activated by a burst of RF radiation near the center frequency of the SAW transducers, each group of transducer fingers sends surface acoustic waves both left and right along the surface of the delay line crystal 14. Such activation occurs as a result of the dipole antenna 16 receiving a transmitted RF signal produced by an interrogator unit oscillator (described below) at the same center frequency as the SAW transducers. Absorbers (not shown) suppress the waves moving to the ends of the delay line crystal 14 and the waves moving to the center of the crystal 14 reach the opposite group of electrodes several microseconds after the initial RF tone burst. There, the waves are reconverted to a RF tone burst that is retransmitted from the microphone unit antenna 16 as a delayed echo of the RF burst signal received from the interrogator unit.

The SAW device's 14 delay is modified in proportion to the surface strain on the crystal, therefore, the transmitted pulse delay of the SAW delay line 14 can be modulated by a sound wave signal, here, a driver's voice. In particular, the surface strain results from a force applied through a push rod 20 from the diaphragm 18, which is forced up and down by the air pressure of the ambient sound in the air surrounding the microphone 10. The diaphragm 18 converts the pressure produced by the sound wave of the driver's voice into the force. The force is then transmitted via the push rod 20 to the free end 22 of the SAW delay line 14, which is mounted as a cantilever beam at the base of the housing 12. The beam flexes the SAW delay line 14, which causes mechanical strain on the crystal surface. As a result, the delay of the SAW delay line 14 varies with the air pressure at the microphone unit 10 generated by the driver's voice.

Because the SAW delay line 14 is designed to create a delayed echo at the two interdigital electrodes in the single transducer, the SAW delay line 14 is able to retransmit the delayed version of the RF signal burst out the antenna 16. The delayed signal, now modulated with the driver's voice, is received by a receive antenna located in the interrogator unit where, as described below, it is demodulated by the interrogator unit as a representation of the driver's voice.

Figure 2:
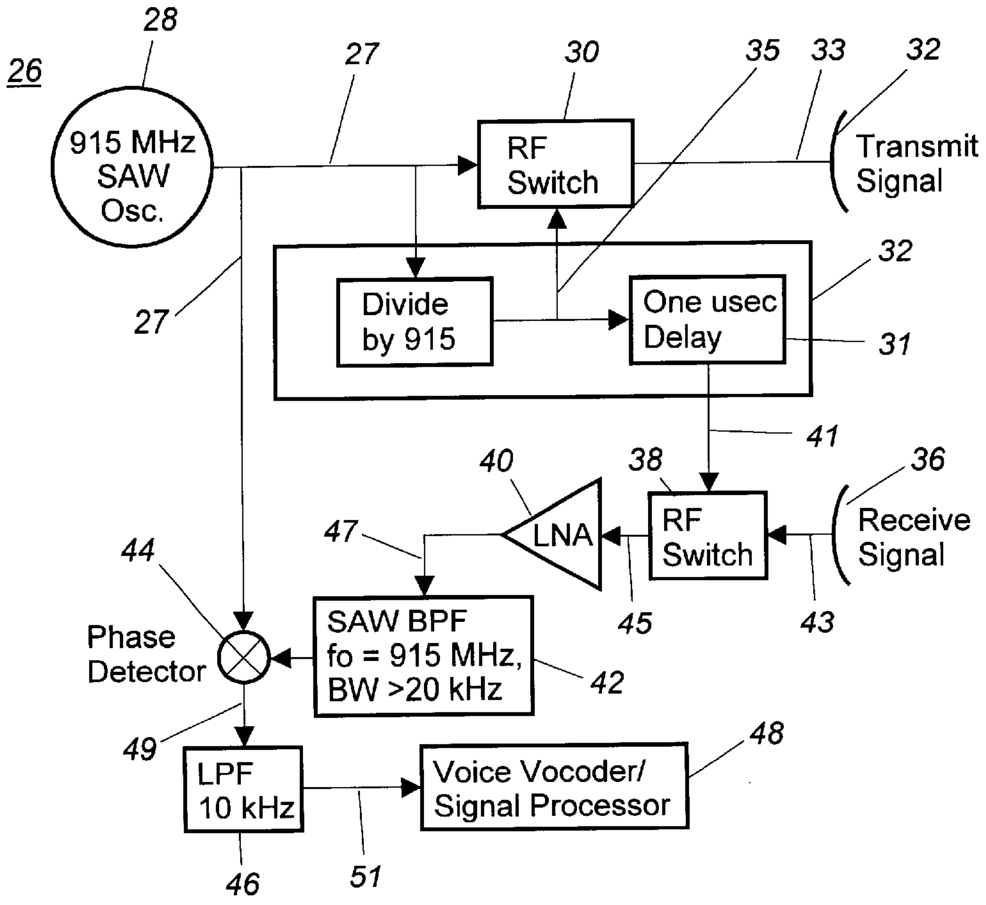
FIG. 2 is a block diagram of an embodiment of a SAW interrogator unit in accordance with an embodiment of the present invention.

Referring to FIG. 2, an interrogator unit 26, herein further referenced as a SAW interrogator unit, includes a surface acoustic wave (SAW) oscillator 28, a RF transmit switch 30, a transmit antenna 32, a receive antenna 36, a RF receive switch 38, and a voice signal processor (voice vocoder) 48. The solid path lines in FIG. 2 represent electrical pathways. For purposes of illustrating the preferred embodiment, the SAW interrogator unit 26 is preferably mounted in the dashboard or sun visor of an automobile where it measures the air pressure at a SAW microphone unit (see, e.g., FIG. 1 at numeral 10) by sending the microphone unit an RF signal pulse burst and receiving back the burst's delayed echo. A sequence of transmitted signal pulse bursts and received signal echo bursts is repeated many times per second such that the air pressure generated by a driver's voice at the SAW microphone unit is measured often enough by the SAW interrogator unit 26, for example, approximately 500,000 time per second, that the measurements provide an accurate representation of the sound of the driver's voice.

More particularly, the SAW oscillator 28 is provided having the same center frequency, here 915 MHz, as the SAW delay line device 14 located in the SAW microphone unit 10 shown in FIG. 1. The SAW oscillator 28 generates a continuous RF signal 27 that is applied to the RF transmit switch 30. Simultaneously, a digital count down divider 34 counts positive pulses of the SAW oscillator's RF signal 27 until the number of pulses reaches 915. Once the number of pulses reaches 915, the digital count down divider 34 actuates the RF switch 30, at numeral 35, to pass a time-gated burst 33 of the SAW oscillator's RF signal 27 to the transmit antenna 32, and the count down divider 34 is reset to start counting again. One microsecond later, the receive RF switch 38 is actuated by a delayed signal 41 from the digital count down divider 34 to receive a time-gated signal echo burst 43 from the receive antenna 36. The digital count down divider delay 31 is set at one microsecond so that the receive RF switch 38 receives the delayed, sound-modulated signal echo burst 43 transmitted from the SAW microphone unit 10 and not the earlier more powerful time-gated signal burst 33 transmitted to the SAW microphone unit 10. The SAW microphone unit 10 returns the signal echo bursts 43 as modulated signals having delays that are proportional to the instantaneous pressure of the air surrounding the microphone unit, as created by the sound of the driver's voice.

The RF receive switch 38 gates the signal echo burst 43 and the gated signal 45 is applied by the RF receive switch 38 to a low noise amplifier 40 that amplifies the gated signal echo burst 45. The amplified signal 47 is then passed through a SAW band pass filter 42 to remove out-of-band noise and interference that would otherwise produce undesired noise in the voice signal received from the SAW microphone unit 10 and later processed by the voice vocoder 48. The center frequency of the SAW band pass filter 42 is preferably set to be the same as the frequency of the SAW oscillator 28. Since the bandwidth of the SAW bandpass filter 42 must pass the spectrum of the modulated radio echo 43 from the microphone unit, the bandwidth is made as narrow as practically possible, but not less than 20 kHz. And, because of the narrow bandwidth of the SAW bandpass filter 42, out-of-band noise and interference are largely eliminated so that the difference in phase between the RF signal 27 and a returned signal echo burst 43 can be accurately measured.

Referring still to FIG. 2, the phase of the amplified signal echo burst 47 is measured against the phase of the continuous RF signal 27 via a phase detecting multiplier 44. The phase change that is measured at the multiplier 44 is a consequence of the change in delay of the SAW microphone unit's RF echo as a result of the voice that modulated the original signal burst 33. The phase signal 49 at the output of the multiplier 44 is applied to a low pass filter 46, preferably a 10 KHz filter, that removes unwanted high frequency components from the phase signal 49 and converts the phase signal 49 into a smoothly varying voltage signal 51 corresponding to the sound of the driver's voice. The voltage signal 51 is sent to the signal processor unit 48 where, using conventional voice recognition techniques, the signal processor 48 interprets the voltage signal 51 as the driver's voice command and uses the command to electrically control a particular device, for example, an automobile windshield wiper.

Figure 3:
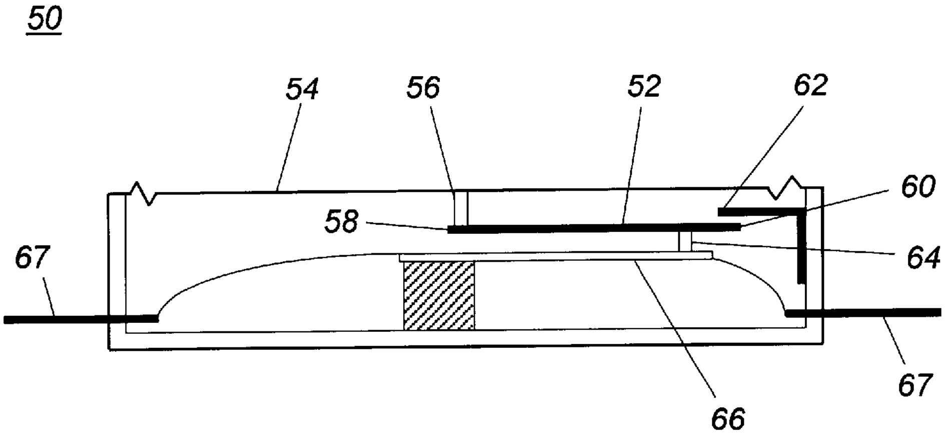
FIG. 3 is a mechanical diagram of a SAW microphone unit including levers in accordance with an alternate embodiment of the present invention.

Referring to FIG. 3, in an alternate embodiment of the present invention, a microphone unit 50 utilizing a lever element 52 to mechanically increase the acoustic sensitivity of the SAW microphone unit 50 is shown. As previously described, the air pressure from a voice sound wave located in the area surrounding the microphone unit 50 creates an initial force against a diaphragm 54. But here, the diaphragm 54, via a first push rod 56, applies the force to the free end 58 of the lever 52 while the opposite end 60 of the lever 52 is constrained from moving by a fulcrum 62 or similar device. Located at the underside of the lever 52, at a point approximately ⅕th as far from the fulcrum 62 as the first push rod 56, is a second push rod 64 which transfers 5 times more force to the free end of the SAW element 66. This additional force increases the flex of the SAW element 66 which in turn proportionally changes the delay of the RF echo, thereby increasing the sensitivity of the microphone unit 50 to the driver's voice. And, as described in FIG. 1, sound waves representing the driver's voice are reconverted to a RF tone burst that is retransmitted from the microphone unit antenna 67 as a delayed echo of the RF burst signal received from the interrogator unit. It is important to note that the use of a single lever, as shown in FIG. 3, can be extended to the use of several levers. For example, by using two levers, a first lever can provide a force multiplication factor equal to five that is then applied to a second lever, which also provides a force multiplication factor equal to five. Thus, increasing the total force pressing against the surface of the SAW element 66 by a factor of twenty-five.

Figure 4:
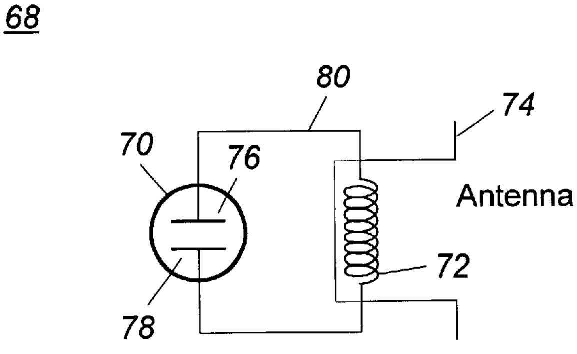
FIG. 4 is a schematic diagram of a capacitor microphone unit in accordance with an alternate embodiment of the present invention.

Referring to FIG. 4, in accordance with another embodiment of the present invention, a capacitor microphone unit 68 is shown. The capacitor microphone unit 68 includes a capacitor microphone 70, an inductor 72 and an antenna 74 (shown as a wire dipole antenna).

The capacitor microphone 70 is a capacitor in which a first plate 76 moves toward and away from a second plate 78 in response to the pressure of sound in the surrounding air. In its most basic form, the first plate 76 is a passively mounted diaphragm that seals the opening of a microphone unit housing (not shown) and the second plate 78 is rigidly fixed in position relative to the back of the microphone housing. Since the first plate 76 moves with the sound wave, the capacitance of the microphone 70 likewise varies with that of the sound wave. Thus, the capacitor microphone 70 indicates changes in the instantaneous pressure of the air by corresponding changes in capacitance.

The inductor 72 and the capacitor microphone 70 are combined in a parallel resonant circuit 80. Since the capacitance of the microphone 70 changes with the sound wave, as described above, the circuit's 80 resonant frequency also changes with the sound wave. The resonant circuit 80 is connected to the antenna 74, such that when a short and broadband RF burst is received by the antenna 74 having a resonant frequency near that of the resonant circuit 80, the RF burst is applied to the resonant circuit 80 where an alternating current at the received frequency builds up in the circuit 80, thereby storing energy. Once the received burst stops transmitting, the alternating current continues to re-radiate ("ring") from the antenna 74 until the stored energy is depleted. Since the re-radiated signal's frequency is set at the resonant frequency of the resonant circuit 80, the frequency provides an indication of the instantaneous acoustic pressure on the capacitor microphone's 68 diaphragm as a result of a voice wave signal. Consequently, a capacitor/crystal interrogator unit, like that described below in FIG. 6, can measure the "ringing" frequency and convert the measurement to one associated with the instantaneous pressure caused by a voice creating a force on the microphone's 70 diaphragm.

Figure 5:
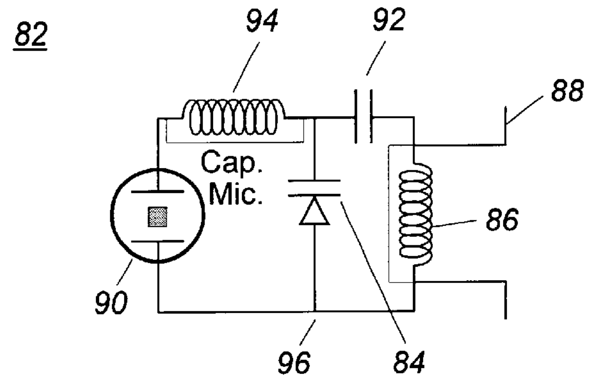
FIG. 5 is schematic diagram of a crystal microphone unit in accordance with an alternate embodiment of the present invention.

Referring to FIG. 5, in accordance with another embodiment of the present invention, a crystal microphone unit 82 is shown. The crystal microphone unit 82 includes a varying capacitor 84, an inductor 86, an antenna 88, a piezoelectric ("crystal") microphone 90, a blocking capacitor 92 and a RF choke 94. Similar to the capacitor microphone unit 68 illustrated in FIG. 4, the crystal microphone unit 82 contains a parallel resonant circuit 96 containing the fixed inductor 86 and the varying capacitor 84, here a varactor, that modulates the resonant frequency of the parallel resonant circuit 96. Also, similar to the capacitor microphone unit 68 illustrated in FIG. 4, the parallel resonant circuit 96 is connected to the antenna 88.

Like the capacitor resonant circuit 80 shown in FIG. 4, the crystal circuit's 96 resonant frequency varies with the changes in the surrounding air pressure due to the sound of a driver's voice. However, unlike the capacitor of the capacitor microphone unit's resonant circuit 80 (see FIG. 4), the capacitor of the crystal resonant circuit 96 is provided as a varactor 84. The varactor 84 is a known semiconductor device having capacitance that is adjusted by applying a direct current (DC) or low frequency bias. Here, the microphone 90, preferably a conventional crystal microphone, generates the bias voltage. A crystal microphone 90 is preferred because of its high output voltage and high impedance, which provides superior sensitivity when, used with the high-impedance varactor 84.

The RF choke 94 is provided to prevent the crystal microphone's 90 capacitance from interfering with the ringing resonant frequency of the resonant circuit 96, and the blocking capacitor 92 is provided to prevent the microphone unit's 82 output voltage from being shorted out by the inductor 86.

Figure 6:
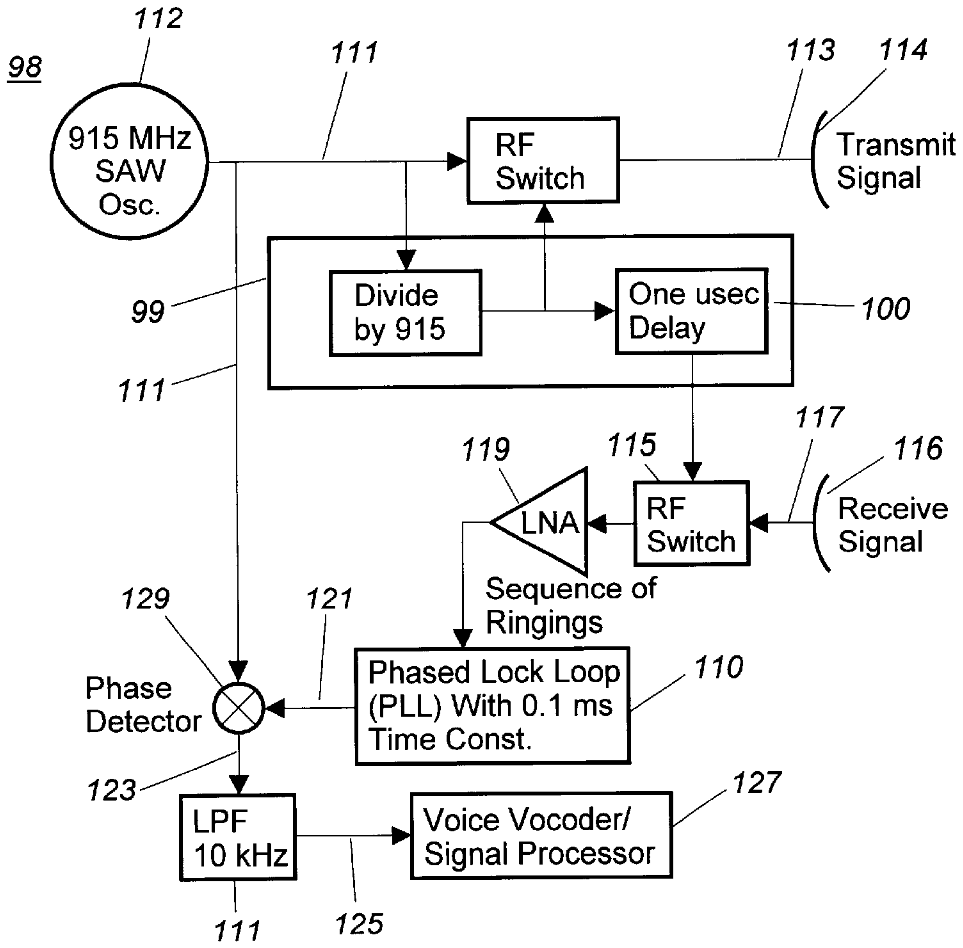
FIG. 6 is a block diagram of a capacitor or crystal interrogator unit in accordance with an alternate embodiment of the present invention.

Referring to FIG. 6, in accordance with another embodiment of the present invention, a capacitor/crystal interrogator unit 98, having similar components and operation as the interrogator unit 26 shown in FIG. 2 except for the inclusion of a two micro second delay 100 within a digital count down divider 99 and a phased lock loop (PLL) 110 preferably having a 0.1 millisecond (ms) time constant, is shown. And, instead of measuring the sound pressure of a voice located at a SAW microphone unit like that shown in FIGS. 1 and 3, the wireless capacitor/crystal interrogator unit 98 measures the sound pressures at a capacitor or crystal microphone unit like those described in FIGS. 4 and 5 above.

Similar to the SAW interrogator unit shown in FIG. 2, the capacitor/crystal interrogator unit 98 transmits a short RF burst 113 (e.g., 1 microsecond burst) generated by gating the continuous signal output 111 of an oscillator 112. The short RF burst 113 is transmitted to a capacitor or crystal microphone unit, via a transmit antenna 114, where it may be modulated with a voice sound wave signal. The modulated RF burst is received by a receive antenna located in the microphone unit, which excites the microphone unit resonant circuit storing energy in an alternating current at the radio frequency. When the interrogator's transmitted burst 113 stops, the stored energy in the microphone unit's resonant circuit continues as an alternating current at the microphone unit's own resonant frequency, which retransmits a "ringing" radio signal out its antenna as it loses energy.

Referring still to FIG. 6, the ringing radio signal transmitted out the microphone unit's antenna is received at the interrogator unit receive antenna 116 as a plurality of RF echo burst signals 117. The signals 117 are each time-gated and amplified by a RF receive switch 115 and a low noise amplifier 119, respectively. And, unlike the interrogator unit illustrated in FIG. 2, the signals 117 are demodulated from the frequency modulated echo of the capacitor or varactor microphone. To accomplish this, a phase locked loop 110 creates a narrowband continuous signal 121 that represents the average frequency and phase of the sequence of frequency-modulated echoes 117 from the microphone. The phase of this average signal 121 will vary along with the frequency of the echoes 117, since the echoes 117 are initially in phase with the transmitted signal 113, but then shift in phase over time due to their different frequencies. Thus, the phase of the signal 121 at the output of the phase locked loop 110, when compared to the continuous signal 111 of the SAW oscillator 112, is a measure of the pressure at the microphone and the multiplier (phase detector) 129 creates a voltage signal 123 corresponding to this phase. The voltage signal 123, after low pass filtering at the filter 111, becomes the audio signal 125 representing the sound heard at the microphone that is analyzed at the voice vocoder 127.

Alternatively, the interrogator unit 98, instead of transmitting short RF bursts 113, could transmit a continuous signal, and the receiving capacitor or crystal microphone unit could receive signals from the interrogator unit on one polarization and retransmit the modulated signal on another polarization. Thus, the microphone unit could differentiate between a signal received from the interrogator unit and its own transmitted signal. The amplitude of the received signal, as described in previous embodiments, would vary with the sound wave pressure in the air surrounding the microphone unit, depending on how close or far the microphone (capacitive or varactor) resonance was in frequency from the interrogator unit's transmitted frequency.

Figure 7:
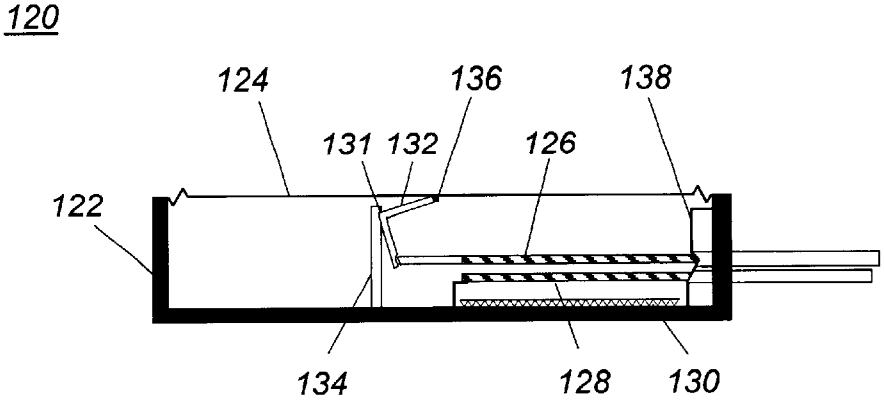
FIG. 7 is a mechanical diagram of an optical microphone unit in accordance with an alternate embodiment of the present invention.
Figure 8A:
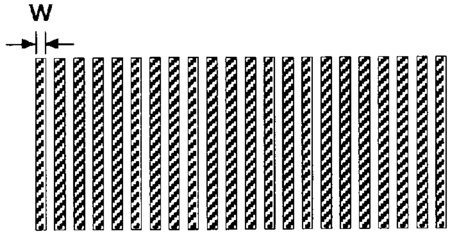
FIG. 8*a* is a graphical illustration of an optical microphone grating mechanism having a pattern of alternating clear and opaque regions each having a width W in accordance with the FIG. 7 embodiment of the present invention.
Figure 8B:
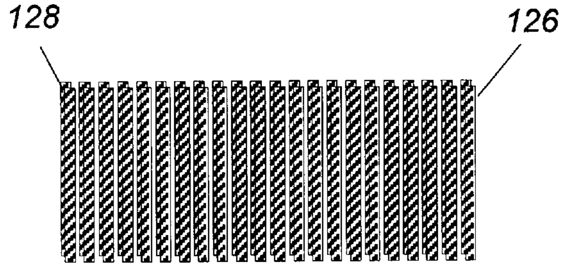
FIG. 8*b* is a graphical illustration of a first optical microphone grating in an W/2 offset position above a stationary second optical microphone grating.
Figure 8C:
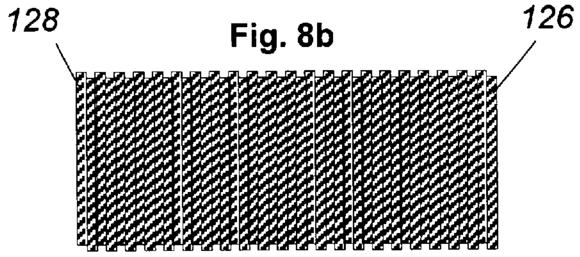
FIG. 8*c* is a graphical illustration of the first optical microphone grating in an W/2 offset position above the stationary second optical microphone grating, providing zero light transmission.
Figure 8D:
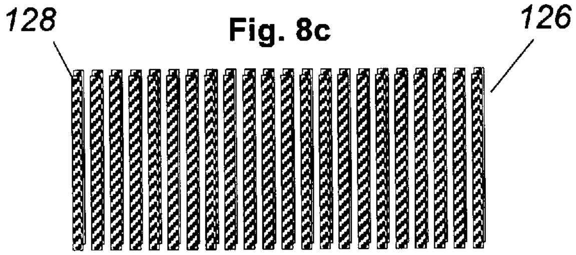
FIG. 8*d* is a graphical illustration of the first optical microphone grating in an W/2 offset position above the stationary second optical microphone grating, providing maximum light transmission.

Referring to FIG. 7, in accordance with another embodiment of the present invention, an optical microphone unit 120, is shown. The optical microphone unit 120 includes a sealed housing 122, a transparent diaphragm 124 mounted in an opening of the housing 122, a lower optical grating 128, an upper optical grating 126, and an array of small corner cubes 130.

In the present embodiment, the air-pressure from the sound of the driver's voice pushes and pulls the diaphragm 124 in a vertical motion. The force from this pressure is then converted from vertical to horizontal pressure by a bent lever 132, which pivots against a notched bracket 134. The lever 132 is held in place by a tab 136 protruding from the bottom of the diaphragm 124. Spring tension in the spring clip 138 applies a force to the optical grating 126, tending to push the grating 126 to the left. Pushing the grating 126 in this manner insures that when the diaphragm 124 moves up and down, the bent lever 132 stays in contact with the diaphragm 124, a fulcrum positioning notch 131 in the notched bracket 134, and the upper optical grating 126. When a top portion of the bent lever 132 is pushed downward, a lower portion of the lever 132 moves to the left, allowing the spring clip 138 to push the upper optical grating 126 to the left while maintaining contact between the upper optical grating 126 and the bent lever 132.

Referring to FIG. 8, because the lower grating 128 is fixed, when the upper grating 126 is displaced by the air pressure and linkage of the driver's voice sound wave, the degree of light blockage by the combination of the two gratings (126, 128) changes accordingly. In particular, referring to FIG. 8*a*, the pair of gratings (126, 128), each containing a pattern of alternating transparent and opaque lines, modulate the amplitude of transmitted light by changing the fraction of the combined pattern which is opaque. Depending on the position of the moving grating, the transmission ranges from approximately 0% to 50%. As shown in FIG. 8*b*, the gratings (126, 128) are adjusted, for example, by shifting the moving grating 126 to the right, such that in the absence of sound, they are displaced by w/2 from each other with a transmission of approximately 25%, where w equals the width of an opaque line or transparent line in the grating (e.g., w=0.001 inches). As shown in FIG. 8*c*, if the pressure of the driver's sound wave displaces the moving grating 126 one line width (w) farther to the right than the stationary grating 128, the transmission is reduced gradually down to 0%. And, as shown in FIG. 8*d*, if the pressure of the driver's voice shifts the moving grating 126 so that the opaque lines in the grating 126 are directly above the opaque lines in the grating 128, the transmission is increased up to a maximum of 50%. Thus an advantageous rest position of the upper grating 126 in the absence of sound would be displaced w/2 left or right from the lower grating 128, so that transmission was 25%. In this rest position, a sound wave would be able to continuously vary optical transmission with pressure changes in both directions up to a maximum of 50% and down to a minimum of 0%.

Referring again to FIG. 7, light from an optical microphone interrogator unit, in FIG. 9 described below, passes through a diaphragm 124 and shines on the pair of gratings (126, 128). The diaphragm 124 is preferably transparent, but may alternatively be mostly opaque except for a transparent window region. The instantaneous position of the upper grating 126 determines how much light passes through the grating pair (126, 128). Light that passes through the grating pair (126, 128) is reflected by the array of corner cubes 130 located at the base of the microphone unit housing 122. The array of corner cubes 130 reflect the light in such a manner that the light reflects back through the gratings (126, 128) and into the interrogator unit. By converting the amplitude of the reflected light to a voltage using a photodetector, the optical microphone interrogator unit, as described in detail below, can recover an electrical audio signal corresponding to the sound detected at the microphone unit 120.

Figure 9:
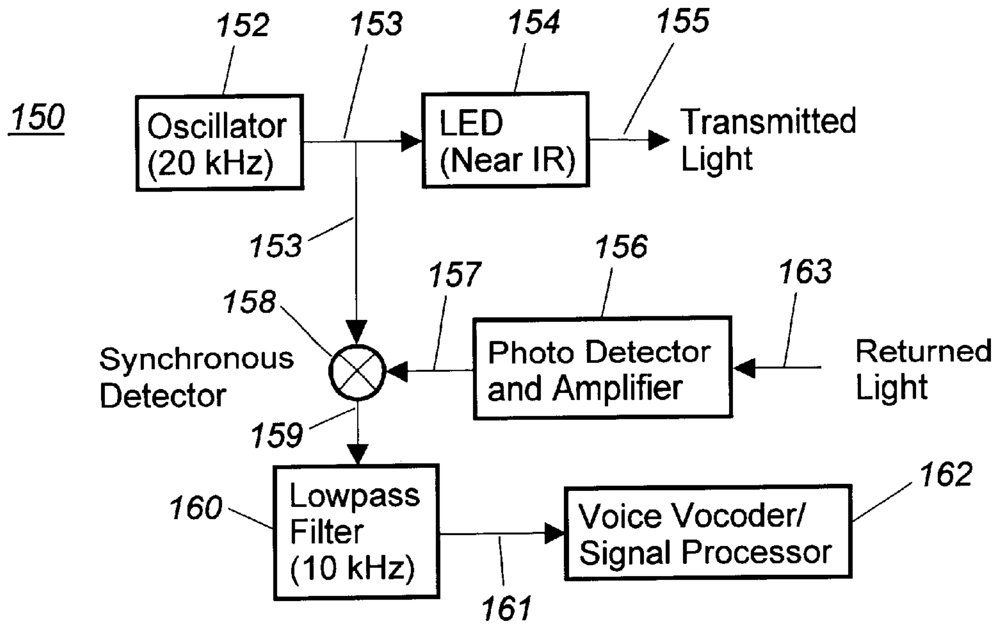
FIG. 9 is a block diagram of an optical interrogator unit in accordance with an alternate embodiment of the present invention.

Referring to FIG. 9, an optical microphone interrogator unit 150 is illustrated including an oscillator 152 or alternatively a pulse generator, a laser or modulated light emitting diode (LED) 154 in the near infrared (IR) range, a photodetector and amplifier element 156, a multiplier 158, a low pass filter (LPF) 160 and a signal processor 162. The interrogator unit 150 is preferably mounted in the dashboard of a car where it is visible to the driver's seatbelt optical microphone unit.

The oscillator 152 produces a 20 kHz signal 153 that powers the near-infrared (IR) light emitting diode (LED) 154 so that the LED 154, herein further referenced as a synchronous detector, transmits 20,000 pulses per second of light 155. The 20 kHz signal 153 is also fed to the multiplier 158 as reference for detecting received light. A modulated version of the optical signal pulse 155 is later returned from the optical microphone unit where the light 163 is received and amplified by the photodetector and amplifier unit 156. The amplified signal 157 is applied to the multiplier 158 where it is synchronously detected to improve its signal-to-noise ratio, thus eliminating all unwanted light signals not modulated at a frequency corresponding to the oscillator's 152 center frequency. The low pass filter 160, preferably a 10 KHz filter, converts the amplitude modulated signal 159 to a smooth voltage signal 161 that is the electrical audio signal corresponding to the sound of the driver's voice. As in previous embodiments, the signal 161 is sent to the signal processor unit 162 where, using conventional voice recognition techniques, the signal processor 162 interprets the electrical audio signal as that corresponding to the driver's voice commands.

Obviously, many modifications and variations of the present invention are possible in light of the above teachings. Thus, it is to be understood that, within the scope of the appended claims, the invention may be practiced otherwise than as specifically described above.

What is claimed is:

1. A system for providing sound wave activated control of an electronic device, comprising:

an interrogator unit for generating a signal and transmitting a pulse of the signal, for receiving a modulated signal, for determining a difference between the signal and the modulated signal corresponding to a sound wave signal containing instructions for controlling the electronic device, and for controlling the electronic device using the instructions of the sound wave signal; and an acoustically driven microphone unit spaced from the interrogator unit, the acoustically driven microphone unit receiving the signal pulse from the interrogator unit, modulating the signal pulse with the sound wave signal to form the modulated signal and transmitting the modulated signal to the interrogator unit.

2. A system as recited in claim 1, wherein the signal is a continuous radio frequency (RF) signal.

3. A system as recited in claim 1, wherein the interrogator unit comprises a surface acoustic wave (SAW) oscillator for generating the signal.

4. A system as recited in claim 1, wherein the interrogator unit comprises a transmit radio frequency (RF) switch for gating the signal thereby forming the signal pulse.

5. A system as recited in claim 1, wherein the interrogator unit comprises a transmit antenna for transmitting the signal pulse to the microphone unit.

6. A system as recited in claim 1, wherein the interrogator unit comprises a receive antenna for receiving the modulated signal from the microphone unit.

7. A system as recited in claim 1, wherein the interrogator unit comprises a receive radio frequency (RF) switch for gating the modulated signal.

8. A system as recited in claim 1, wherein the interrogator unit comprises a digital countdown divider for counting positive pulses of the signal until the number of pulses reaches a predetermined value and, where the predetermined value is reached, actuating the transmission of the signal pulse to the microphone unit and, upon the expiration of a predetermined delay, actuating the receipt of the modulated signal from the microphone unit.

9. A system as recited in claim 1, wherein the interrogator unit comprises a low noise amplifier for amplifying the modulated signal.

10. A system as recited in claim 1, wherein the interrogator unit comprises a surface acoustic wave (SAW) band pass filter for removing out-of-band noise and interference from the modulated signal.

11. A system as recited in claim 1, wherein the interrogator unit comprises a multiplier for measuring the difference between the continuous signal and the modulated signal and generating the sound wave signal corresponding thereto.

12. A system as recited in claim 11, wherein the interrogator unit comprises a low pass filter for removing high frequency component from the sound wave signal and generating a voltage signal corresponding thereto.

13. A system as recited in claim 12, wherein the voltage signal is a smoothly varying voltage signal.

14. A system as recited in claim 12, wherein the interrogator unit comprises a signal processor unit, the signal processor unit receiving the voltage signal and interpreting the voltage signal as the instructions for controlling the electronic device.

15. A system as recited in claim 14, wherein the signal processor unit is a voice vocoder.

16. A system as recited in claim 1, wherein the acoustically driven microphone unit comprises a surface acoustic wave (SAW) element for producing the modulated signal as a delayed echo burst of the signal pulse, the delayed echo burst generated by a force applied to a surface of the surface acoustic wave element, the force resulting from a pressure of a sound wave in the air surrounding the microphone unit.

17. A system as recited in claim 16, wherein the surface acoustic wave (SAW) element is a delay line.

18. A system as recited in claim 16, wherein the acoustically driven microphone unit comprises a diaphragm for absorbing the pressure of the sound wave in the air surrounding the microphone unit.

19. A system as recited in claim 18, wherein the acoustically driven microphone unit comprises a first pushrod disposed between the diaphragm and the surface acoustic wave element, the first pushrod transferring the pressure absorbed by the diaphragm into the force applied to the surface of the surface acoustic wave element.

20. A system as recited in claim 19, wherein the acoustically driven microphone unit further comprises a lever disposed between the diaphragm and the surface acoustic wave element, the lever absorbing the sound wave pressure on the diaphragm at the first pushrod; and a second pushrod disposed between the lever and the surface acoustic wave element, the second pushrod transferring the pressure absorbed by the lever to the surface of the surface acoustic wave element, the transferred pressure increasing the force applied to the surface of the surface acoustic wave element by a factor of M in response thereto.

21. A system as recited in claim 1, wherein the acoustically driven microphone unit comprises an antenna for receiving the signal pulse from the interrogator unit and transmitting the modulated signal to the interrogator unit.

22. A system as recited in claim 21, wherein the antenna is an antenna selected from the group consisting of dipole antenna, patch antenna, and loop antenna.

* * * * *